United States Patent [19]

Johnson et al.

[11] Patent Number: 5,167,513
[45] Date of Patent: Dec. 1, 1992

[54] LOAD LIMITED PIN FOR AN ELECTRICAL CONNECTOR

[75] Inventors: Richard A. Johnson; Howell B. Schwartz; Prabjit Singh; Basil D. Washo, all of Poughkeepsie, N.Y.

[73] Assignee: International Business Machines Corp., Armonk, N.Y.

[21] Appl. No.: 744,761

[22] Filed: Aug. 14, 1991

[51] Int. Cl.⁵ .................................. H01R 9/09
[52] U.S. Cl. .................................. 439/78; 439/83; 439/474
[58] Field of Search ............... 439/474, 475, 78-14, 439/660

[56] References Cited

U.S. PATENT DOCUMENTS

| | | | |
|---|---|---|---|
| 4,486,066 | 12/1984 | Minter | 439/81 |
| 4,682,829 | 7/1987 | Kunkle et al. | 439/83 |
| 4,815,982 | 3/1989 | Sadigh-Behzadi | 439/82 |
| 4,923,405 | 5/1990 | Munsterman et al. | 439/78 |
| 5,006,179 | 4/1991 | Gaddy | 439/474 |

*Primary Examiner*—David L. Pirlot
*Attorney, Agent, or Firm*—Floyd A. Gonzalez

[57] ABSTRACT

A connector pin that has one or more regions along its length modified in cross-section so the region deforms plastically as a result of stress induced by displacement of connected members. As used herein, plastic definition means that the structure approaches a condition where it will continue to yield without increase in load. Each region therefore provides a deformable or "plastic" hinge, limiting a moment applied to the solder joint as a result of lateral displacement of the connector relative to the circuit board.

6 Claims, 2 Drawing Sheets

LOAD LIMITED PIN FOR AN ELECTRICAL CONNECTOR

BACKGROUND OF THE INVENTION

1. Field of the Invention

This invention relates to pin connectors, and more particularly, to an improved connector pin that limits the bending moment and forces transferred by the pin.

2. Description of the Prior Art

As will be appreciated by those skilled in the art, connectors with a large number of densely-spaced pins are commonly used in the electronics and computer industries. In the type of connector contemplated by this invention, the pins extend from a housing and are inserted in recesses in a printed circuit board where they are mechanically and electrically coupled to the board by solder. Movement of the connector housing with respect to the board, which, for example, results under thermal cycling if the housing and the board have different thermal coefficients of expansion, can result a bending moment or other force transmitted by the pin to the solder joint, stressing the joint and causing its failure.

Plastically deformable structures are referred to in the prior art. Popov, "Mechanics of Materials", ed. 2, Prentice-Hall, c. 1976, pg. 440–446), provides a structural analysis to determine the ultimate load-carrying capability of a structural member.

SUMMARY OF THE INVENTION

An object of this invention is the provision of a connector pin which limits the load and/or bending moment forces transmitted by the pin as a result of relative displacement of a connector and printed circuit board to which it is attached. Another object of the invention is the provision of a bending moment and load limiting pin which can be used in high-density pin connectors; a pin which does not substantially increase manufacturing costs; and a pin which is compatible with manufacturing techniques employed with conventional prior art pin connectors.

Briefly, this invention contemplates the provision of a connector pin that has one or more regions along its length modified in cross-section so the region deforms plastically as a result of displacement of connected members. As used herein, plastic deformation means that the modified region of the pin approaches a condition where it will continue to yield without increase in force. Each region therefore provides a deformable or "plastic" hinge, limiting any moment applied to the solder joint as a result of lateral displacement of the connector relative to the circuit board.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figures 1, 2, 3:
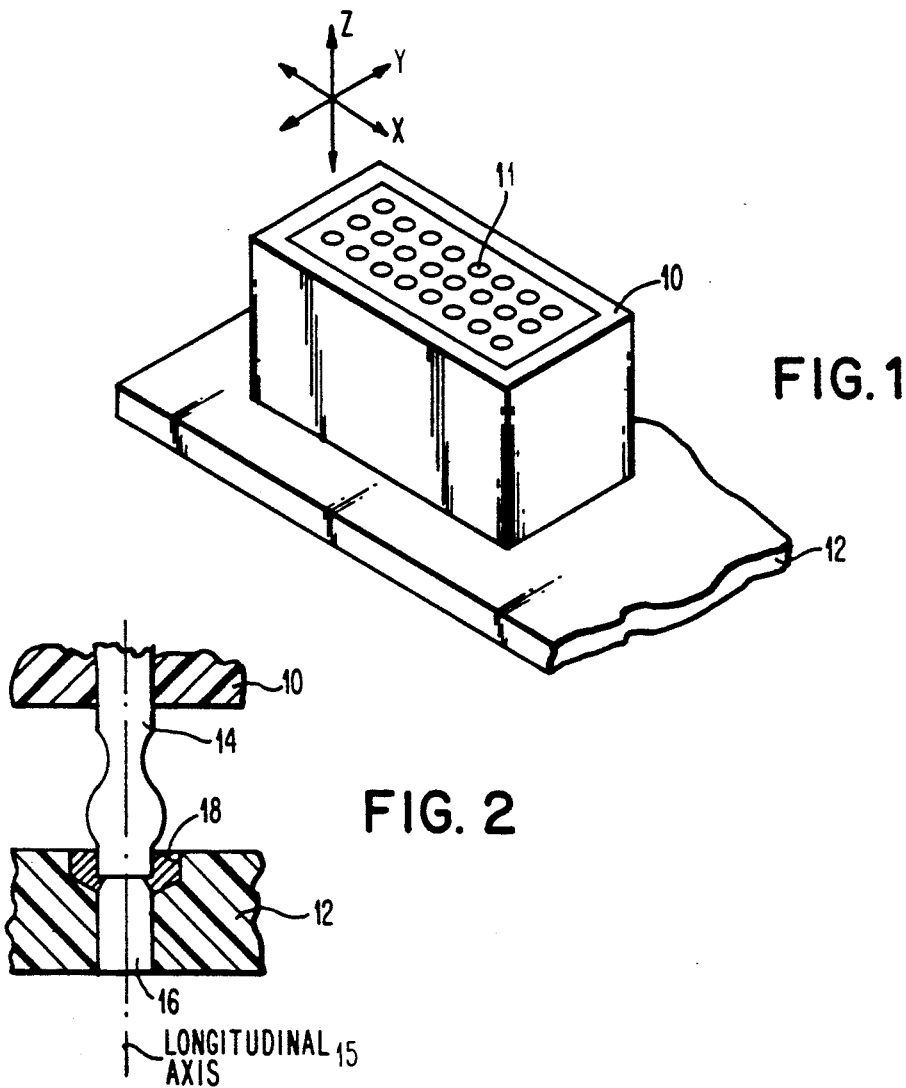
FIG. 1 is a partial view of multi-pin connector housing secured to an epoxy-printed circuit board.
FIG. 2 is a fragmentary, view (with parts in section) showing a connector pin in accordance with the invention teachings of this invention soldered to a printed circuit board.
FIG. 3 is a composite of elevation and partial sectional views of a connector pin in accordance with the teachings of this invention.

Referring now to FIG. 1 of the drawings, it shows a multi-pin connector housing 10 secured to a printed circuit board 12. Both the connector housing 10 and the printed circuit board 12 may be of conventional prior art designs; the connector housing is typically rectangular in shape and carries a dense array of male or female contacts, indicated generally by reference numeral 11, adapted to mate respectively with female or male contacts carried by another removable housing (not shown). The connector housing 10 is typically a molded plastic unit and the printed circuit board 12 is typically made of a suitable glass epoxy material.

Referring now to FIG. 2 in addition to FIG. 1, the male or female connectors carried by the housing 10 are electrically connected to the conductors on the printed circuit board 12 by a number of conductive pins of which conductive pin 14 is exemplary. The conductive pin 14 is disposed along a longitudinal axis 15 with one end of the pin 14 electrically connected to the male or female connector (not shown). Pin 14 is mechanically secured to the housing 10; typically a portion of the pin 14 is molded into the wall of the housing 10. The other end of the pin 14 is disposed in an upper counter sunk region of a conductively plated passage 16 in the board 12 or otherwise connected to passage 16 with solder 18. The solder joint 18 mechanically and electrically secures the pin to the board.

It will be appreciated that any differential thermal expansion or contraction of the housing 10 relative to the board 12 will exert forces along the axes marked X and Y in FIG. 1 and that the largest forces will be experienced by the pins in the corner regions of the housing 10. In this example the "elastic foundation" for resisting pin loading does not act through the normal full-plated through hole length 16, but rather for a fraction of it. Therefore, stresses generated for even a very small diameter pin are high, if it were to deform elastically.

Referring now to FIG. 3, pin 14 is made of a conductive material having a low yield strength and, in this embodiment of the invention, the regions 20 and 22 at either end are circular in cross-section. Pin 14 has two regions 24 and 26 that are modified in cross-section configuration to provide two regions which will readily plastically deform in response to a bending moment or load. The regions 24 and 26 are generally rectangular or elliptical in cross-section so that the dimensions ($d_1$) along one axis orthogonal to the pin longitudinal axis and $d_2$ along the other orthogonal axis are both less than the diameter of the pin in regions 20 and 22. Preferably, the dimensions $d_1$ and $d_2$ in combination with the pin material chosen so that each region will plastically deform in response to a load that is less than the load required to stress the solder joint to a failure mode. At the same time, in this embodiment, the cross-sectional area of modified regions 24 and 26 through any cross-section is substantially the same as the cross-sectional areas of regions 20 and 22 so that the electrical resistance is substantially unchanged along the length of the connector pin. The regions 24 and 26 are oriented perpendicularly with respect to one another to provide low resistance to bending moments about two orthogonal axis perpendicular to the pin longitudinal axis and serve as "plastic hinges" thereby limiting the moment applied to the solder joint 18. Two regions are used owing to the two significant expansion directions of the rectangular housing although for some applications a single region may be significant. Selecting the section dimensions properly can reduce the moment to one-fourth or less of what it would be if the pin were of uniform circular cross-section. Using a low yield strength material for the pin can reduce the transmitted moment still further.

Figure 4:
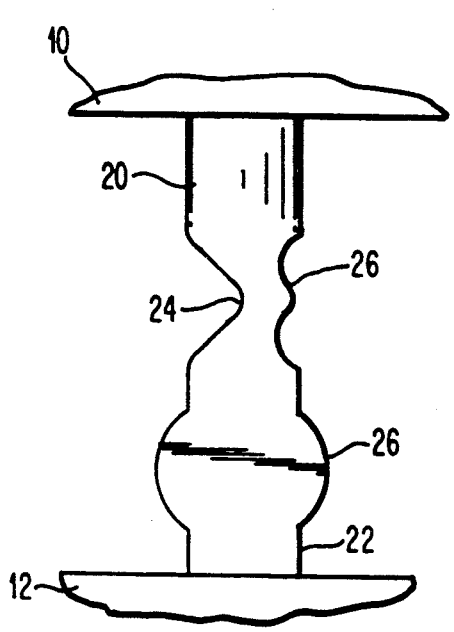
FIG. 4 is a view of another embodiment of the invention similar to the embodiment of FIG. 3, but with an additional elastic or compliant member to limit the axial force transmitted by the pin to the solder joint.

Referring now to FIG. 4, in this embodiment a localized curved region 26 (i.e., a kink) is formed in the beam 20 along its length in order to generate an elastic axial compliance in the pin in response to an axial force. This localized curved region 26 limits transmission of forces along the Z axis, forces that may be generated on the connector during withdrawal of its mate before a stress relief member comes into play, or due to "Z" direction temperature coefficient of expansion material mismatch.

Figure 5:
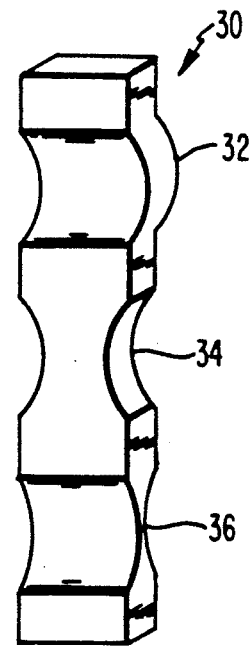
FIG. 5 is a view showing an alternate embodiment of the invention.

FIG. 5 shows a pin 30 with a rectangular cross-section, one of several possible alternative pin geometries. Here, an optional curved region 32 provides longitudinal axial (Z axis) elastic compliance. Regions 34 and 36 of reduced cross-sectional area provide X and Y axis plastic compliance.

Figure 6:
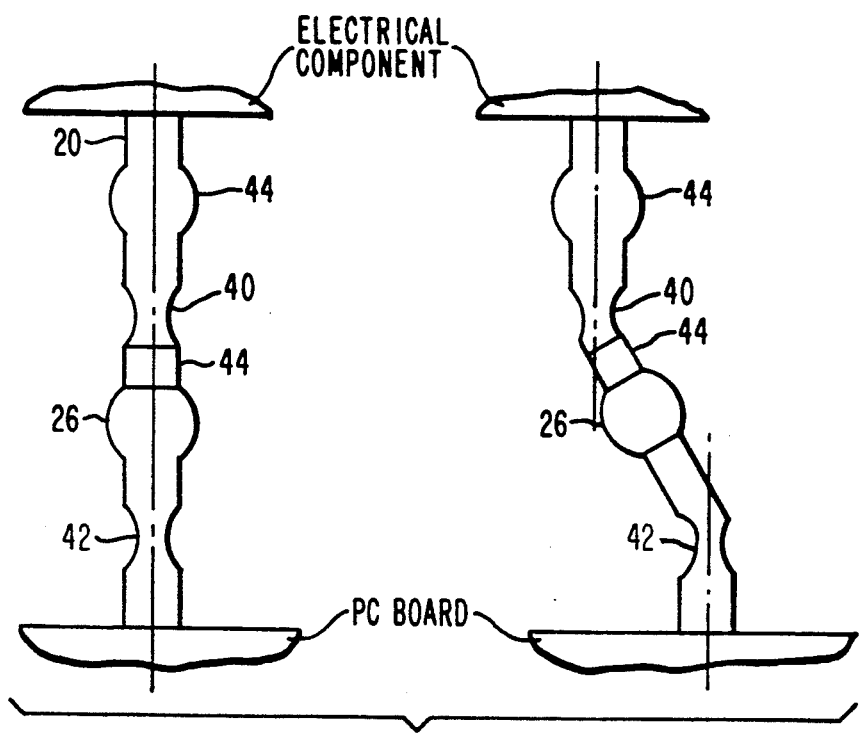
FIG. 6 is a view showing yet another embodiment of the invention.

FIG. 6 illustrates an alternative embodiment of the invention similar to that of FIG. 3 but with two additional plastic hinge regions 40 and 42 located along the length of the pin so that the ends where the pin is attached to an electrical component and a printed circuit board remain perpendicular to the component and board respectively despite movement of the component relative to the board and bending of the plastic hinges. A "Z" axis elastically compliant section 44 may also be provided.

In fabricating pins designed in accordance with the teachings of this invention (forming the plastic hinge regions by swageing for example), it may be advantageous in certain cases to employ a stress-relief annealing process to ensure the regions of modified geometry are not excessively work hardened. Ideally the pin material should be ductile; that is, minimally work hardened. The following materials are examples of suitable materials for fabricating pins in accordance with the teachings of this invention: electrical tough pitch copper (C11000); oxygen free copper (C10100); and oxygen free copper (C10200).

While the invention has been described in terms of a single preferred embodiment, those skilled in the art will recognize that the invention can be practiced with modification within the spirit and scope of the appended claims. For example, the principles of the invention may be used generally to connect an electrical component to a printed circuit board.

Having thus described our invention, what we claim as new and desire to secure by Letters Patent is as follows:

1. A mechanical load-limiting conductive member for electrically connecting an electrical component to a substrate, comprising in combination:

a conductive member circular in cross-section;
one end of said conductive member secured to said electrical component and the other end of said conductive member frangibly secured to said substrate; and
said conductive member having a region of modified approximately rectangular cross-section that yields plastically in response to stress induced by relative displacement of said electrical component and said substrate along a first axis, thereby limiting loading applied to said substrate.

2. A mechanical load-limiting conductive member for electrically connecting an electrical component to a substrate, comprising in combination:

a conductive member circular in cross-section;
one end of said conductive member secured to said electrical component and the other end of said conductive member frangibly secured to said substrate;
said conductive member having a first region of modified approximately rectangular cross-section so that it yields plastically in response to stress induced by relative displacement of said electrical component and said substrate along a first axis, thereby limiting loading applied to said substrate along said first axis; and
said conductive member having a second region of modified approximately rectangular cross-section so that it yields plastically in response to stress induced relative displacement of said electrical component and said substrate along a second axis orthogonal to said first axis, thereby limiting loading applied to said substrate along said second axis.

3. A mechanical load-limiting conductive member for electrically connecting an electrical component to a substrate, comprising in combination:

one end of said conductive member secured to said electrical component and the other end of said conductive member frangibly secured to said substrate;
said conductive member having a first region of modified cross-section so that it yields plastically in response to stress induced by relative displacement of said electrical component and said substrate along a first axis, thereby limiting loading applied to said substrate;
said conductive member having a second region of modified cross-section so that it yields plastically in response to stress induced relative displacement of said electrical component and said substrate along a second axis orthogonal to said first axis, thereby limiting loading applied to said substrate along said second axis; and
said conductive member having a third region that yields plastically in response to stress induced relative displacement of said connector housing and said substrate along a third axis, thereby limiting loading applied to said substrate along said third axis.

4. A mechanical load-limiting conductive member as in claim 3 wherein said conductive member is generally circular in cross-section.

5. A mechanical load-limiting conductive member as in claim 3 wherein said conductive member is generally rectangular in cross-section.

6. A mechanical load-limiting conductive member for electrically connecting an electrical component to a substrate, comprising in combination:

a conductive member circular in cross-section;
one end of said conductive member secured to said electrical component and the other end of said conductive member frangibly secured to said substrate;
said conductive member having a first region of modified cross-section so that it yields plastically in response to stress induced by relative displacement of said electrical component and said substrate along a first axis, thereby limiting loading applied to said substrate along said first axis; and
said conductive member having a second region of modified cross-section so that it yields plastically in response to stress induced relative displacement of said electrical component and said substrate along a second axis orthogonal to said first axis, thereby limiting loading applied to said substrate along said second axis.

* * * * *